United States Patent
Chan et al.

[11] Patent Number: 5,124,591
[45] Date of Patent: Jun. 23, 1992

[54] LOW POWER PUSH PULL DRIVER

[75] Inventors: Francis Chan, Fishkill; William M. Chu; Edward B. Eichelberger, both of Hyde Park; David A. Kiesling, Pleasant Valley, all of N.Y.

[73] Assignee: International Business Machines Corporation, Armonk, N.Y.

[21] Appl. No.: 577,353

[22] Filed: Sep. 4, 1990

[51] Int. Cl.⁵ .................. H03K 5/22; H03K 19/20
[52] U.S. Cl. .................... 307/494; 307/455; 307/355
[58] Field of Search .............. 307/362, 454, 455, 494, 307/496, 262, 300, 315, 355

[56] References Cited

U.S. PATENT DOCUMENTS

| | | | |
|---|---|---|---|
| 4,513,283 | 4/1985 | Leininger | 307/455 |
| 4,533,838 | 8/1985 | Fujita | 307/270 |
| 4,593,211 | 6/1986 | Belforte | 307/454 |
| 4,680,480 | 7/1987 | Hopta | 307/455 |
| 4,686,392 | 8/1987 | Lo | 307/455 |
| 4,691,174 | 9/1987 | Nelson et al. | 307/300 |
| 4,748,346 | 5/1988 | Emori | 307/270 |
| 4,760,289 | 7/1988 | Eichelberger | 307/465 |
| 4,777,388 | 10/1988 | Widener | 307/443 |
| 4,806,800 | 2/1989 | Khan | 307/455 |
| 4,810,908 | 3/1989 | Suzuki et al. | 307/455 |
| 4,864,166 | 9/1989 | Gloaguen | 307/443 |
| 5,017,814 | 5/1991 | Lloyd | 307/455 |
| 5,025,180 | 6/1991 | Kim et al. | 307/455 |
| 5,043,602 | 8/1991 | Flannagan | 307/455 |

Primary Examiner—Stanley D. Miller
Assistant Examiner—Terry D. Cunningham
Attorney, Agent, or Firm—Robert L. Troike

[57] ABSTRACT

A low power push pull off chip driver for differential cascode current circuitry is described that includes the collectors of a differential pair directly coupled to bases of a push pull driver and level shifters coupled to the input of the differential pair to prevent saturation of the differential pair.

1 Claim, 2 Drawing Sheets

LOW POWER PUSH PULL DRIVER

FIELD OF THE INVENTION

This invention relates to driver circuits and more particularly driver circuits between computer chips.

BACKGROUND OF THE INVENTION

In present day data processing systems most of the circuits and more specifically the logic circuits are in the form of integrated circuits. Efforts continue to be made to increase the density of integration of the circuit components on a single semiconductor substrate or chip. In a typical system there may be a hundred such chips in one thermal controlled module (TCM). There may be several TCM's a computer system. For today's bipolar logic chips logic performance (speed) is largely a function of the power that is available for the critical logic paths. For chips with five thousand or more logic gates, the power budget indeed limits the speed of the computer system it is used in. Push-pull drivers are widely used on these logic chips in all off chip applications. There is a need for efficient current drivers for driving signals between chips. FIG. 1 labeled prior art is a typical push pull driver circuit for driving between chips which use differential cascode current switch circuitry as disclosed generally in a IBM Corporation U.S. Pat. No. 4,513,283 of Lininger entitled "Latch Circuits with Differential with Cascodes Current Switch Logic", U.S. Pat. No. 4,760,289 of Eichelberger et al. entitled "Two Level Differential Cascode Current Switch Masterslice" and Low U.S. Pat. No. 4,686,392. These patents are incorporated herein by reference. This driver is particularly for use with differential cascode circuitry which requires lesser current and is lower power than ECL circuitry. The logic is provided by a pair of wires and for a logic "1" level 0.6 volts is on one lead and 0.4 volts on the other lead for and for logic "0" the levels are reversed. A 20 percent increase in performance is achieved using this differential cascode current switch as compared with ECL masterslice circuits running the same power. The prior art circuit shown in FIG. 1 is a push pull driver using as a predriver the differential cascode current switch circuitry. As discussed previously the driver of FIG. 1 is used between chips within a given TCM or between TCM's for example, and maybe used further for cabling or outbound connections. Differential cascode circuit has two wires for input and that being at the −A and +A terminals in FIG. 1. A single ended output is at terminal B. The circuit of FIG. 1 includes large power transistors 10 and 11 connected in series between VCC and VT with the junction J of the transistors being coupled to the output terminal B. A differential cascode current switch predriver including transistors 12 and 13 is coupled between VCC and VEE. The differential signal at +A and −A steers the current through transistors 12 and 13. The voltage drop across the collector resistor of transistor 12 controls the conduction or cutoff of transistor 10. The conduction and cutoff of lower transistor 11 is provided by the emitter follower circuit including transistor 16 and resistors 14 and 15. This emitter follower circuit provides level shifting to prevent saturation of the input stage transistor 13. Without the emitter follower COC would have to be very low voltage causing T13 to saturate. The node at COC can get too low such that the base is higher than the collector. The emitter follower prevents this and further provides current gain to get better drive.

This emitter follower circuit, however, dissipates about 3.6 milliwatts of power per driver. This results in a typical TCM with many drivers to an average of 17 watts. This makes for additional cooling and in particular can necessitate a water cooling system and the attendant additional costs.

SUMMARY OF THE INVENTION

In accordance with one embodiment of the present invention a low power push pull driver is provided by series connected power transistors with the junctions of the transistors coupled to the output terminal and wherein the predriver for said transistors comprises a differential current switch circuit including a pair of transistors with the collectors of both pair of transistors directly coupled to the bases of the power transistors for direct control thereof.

DESCRIPTION OF PREFERRED EMBODIMENT

Figure 2:
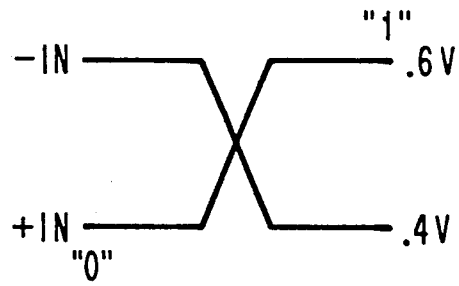
FIG. 2 is a diagram illustrating the voltage levels for logic "1" and logic "0" in differential cascode logic for FIG. 1.
Figure 3:
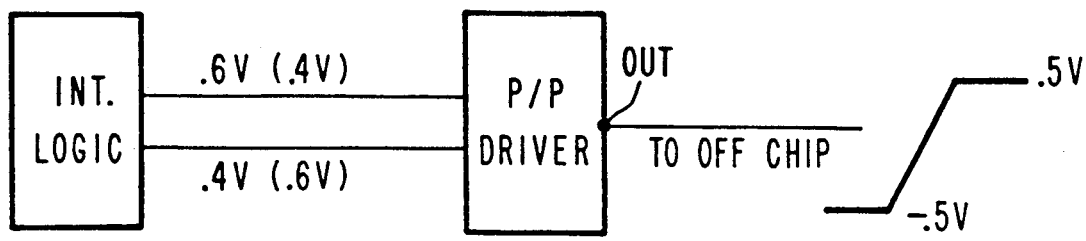
FIG. 3 is a block diagram illustrating the internal logic and the push pull driver output logic levels according to the present invention.

Referring to FIG. 2 there is illustrated the differential cascode logic values. For logic "0" state the +IN input (or +A) is at 0.4 volt to the differential switch and at the −IN input the level is 0.6 volt and for a logic "1" state the +IN input is at 0.6 volts and the −IN input is at 0.4 volts. As shown in FIG. 3 the internal logic values are at 0.6 volts and 0.4 volts and these two voltages are applied at the input of the push pull driver and the output from the driver to go from chip to other chips is a single output that goes between −0.5 volts and +0.5 volts.

Figure 4:
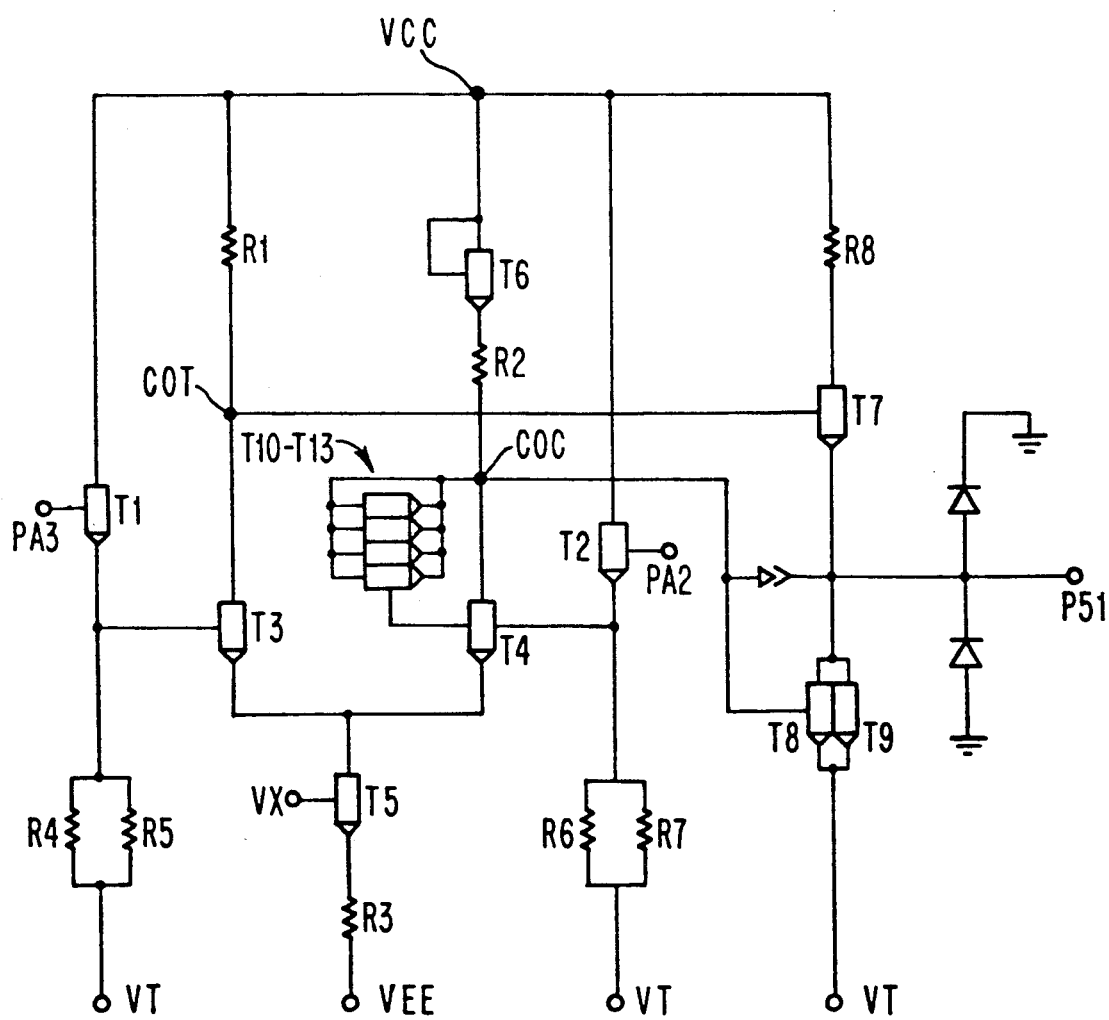
FIG. 4 is the differential cascode of lower power push pull driver according to the preferred embodiment of the present invention.

A preferred embodiment of the present invention is shown in FIG. 4. This push pull driver has differential inputs at PA2 and PA3 and a switch output at P51. The present invention has high independence level shifted inputs at the collector node of T4 (CO)) which is fed directly into the base of transistor combination T8, T9 without the extra level shifting circuitry.

The inputs at PA2 and PA3 are applied to transistors T2 and T1 respectively. The transistors T1 and T2 level shift the input to the base of differential cascode current switch pair of transistors T3 and T4. The 0.6 volt input is level shifted to −0.2 and 0.4 volt is level shifted to −0.4 volt. The collectors of transistors T1 and T2 are coupled to the collector voltage VCC. The emitter of transistor T1 is coupled via parallel resistors R4 and R5 to VT and to the base of transistor T3. The emitter of transistor T2 is coupled via to parallel resistors R6 and R7 to VT and base of transistor T4.

The differential cascodes current switch pair includes transistors T3 and T4 coupled at their emitters to a current source comprising transistor T5 and resistor R3 which powers the switch. Transistors T5 and resistor R3 are coupled in series between the junction of the emitters of transistors T3 and T4 and potential VEE. The base of transistor T5 is biased with current control voltage VX. The collector of transistor T3 is coupled to source VCC via load resistor R1. The collector of transistor T4 is coupled via load resistor R2 and diode connected transistor T6 to the voltage VCC.

The push pull power transistor switches T7 and T8/T9 are connected in series between the voltage VCC and voltage VT. The push pull output is taken at P51 coupled to junction of power transistor switches T7 and T8/T9. The transistors T8 and T9 are connected in parallel to improve the power handling capability. The collector node COT of transistor T3 is directly coupled to the base of transistor T7 and the collector node COC of the transistor T4 is directly coupled to the base of transistor switch combination T8/T9.

With the input at PA3 high and PA2 low the base of T3 is high and base of T4 is low causing T3 to conduct and T4 is cutoff. COT is low due to drop across R1 turning off transistor T7 while COC will be high turning on transistor combination T8, T9 pulling node P51 to a logic "0" state. With PA3 low and PA2 high the base of T3 is low and the base of T4 is high causing T3 to be cutoff and T4 to conduct. COT node will be high turning on transistor T7 and COC will be low turning off transistors T8/T9. Transistor T7 will pull node P51 to a logic "1" level.

Figure 1:
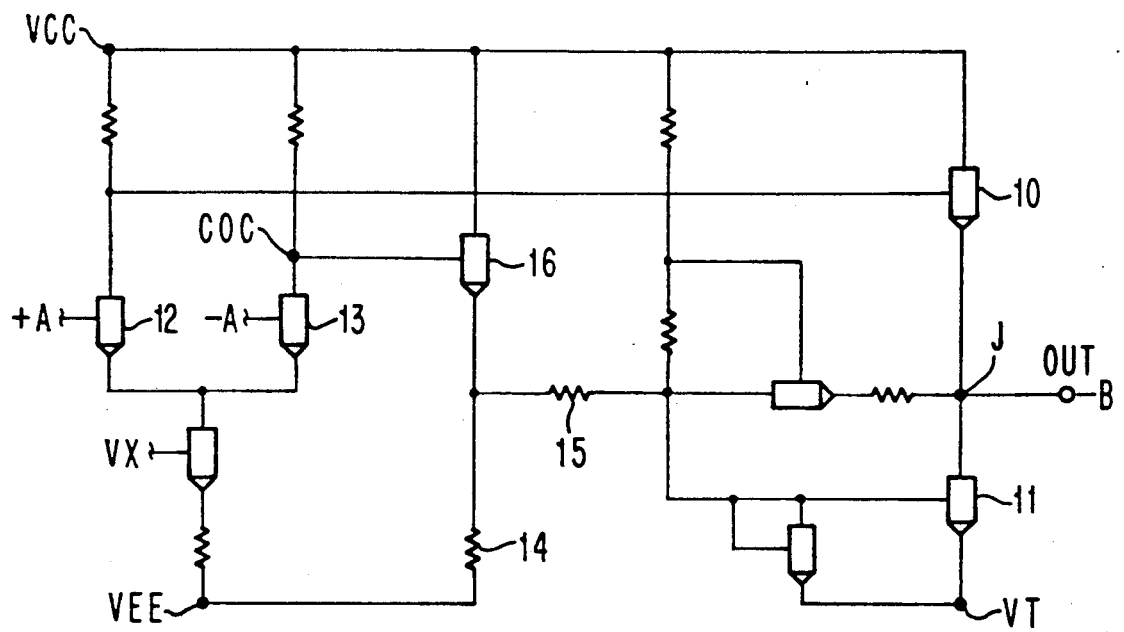
FIG. 1 is a schematic drawing of prior art push pull driver.

The level shifters T1 and T2 lower the base voltage for transistor T4 and T3 to prevent saturation. Input at transistors T1 and T2 exhibit 15 times smaller base load than the standard push pull driver of FIG. 1. The standard driver is limited to two per internal net, while an internal net may drive ten or more ultra low power push pull drivers. The reduced base load solves the voltage drop concerns on the chip internal net, allows greater wireability and adds functionality with relaxed fan out restrictions. In addition diode biased (collector to base connected) transistor T6 and resistor R2 are also reduces the variability of the lower COC node voltage. Resistor R2 and transistor T6 are chosen to reduce the gain of the circuit without substantially changing the node voltage at node COC. The low level COC node voltage must keep from saturating T4. Reduced gain in the circuit directly reduces the COC node voltage variation. Without transistor T6 and resistor R2 together saturation of transistor T4 is likely in worst case situations. Node COT does not require as large a signal swing and transistor T3 is not near saturation. Saturation of transistor T4 would also add a large delay penalty to the circuit. Resistor R8 is a small valued current limiting resistor. A schottky barrier (metal-semiconductor) diode is coupled between the base input and collector input of transistor combination T8 and T9 to keep this from saturation. Also four parallel connected transistors T10 and T13 are connected between the base and collector of transistor T4. These transistors act as a capacitor to slow down the pull down time of the lower switch of transistors T8 and T9 so they do not conduct before transistor T7 is off.

In the above described circuit the elements had the following values:

| | | |
|---|---|---|
| VCC = 1.4 V, | VEE = −2.2 V, | VT = −0.7 V |
| VX = 0.8 V, | R1 = 1420 ohms, | R2 = 850 ohms |
| R3 = 580 ohms, | R4 = 4.09K, | R5 = 3.04K, |
| R6 = 4.09K. | R7 = 3.04K, | R8 = 44 ohms |

Although the above described arrangement used the differential cascode switch circuitry the principle may also be used with ECL logic where one of the pair of inputs is at reference potential with the collector outputs directly coupled to the push pull drivers.

While the invention has been described with reference to preferred embodiments that would be understood by those skilled in the art the various changes in form and details may be made without departing the scope of this invention.

What is claimed is:

1. A low power push pull off chip driver for bipolar logic chips used in computer systems wherein said driver input is coupled to differential cascode current switch circuitry which provide for logic "0" a first and a second voltage level at respective first and second input terminals of said driver and for a logic "1" said first and said second voltage level at said respective second and first input terminals comprising:

first and second means for providing first and second levels of potential;

first and second power transistor switches each having an emitter terminal, a collector terminal and a base terminal, said first and second power transistor switches connected in series between said first and second means with the collector terminal of the second power transistor switch coupled to the emitter terminal of said first power transistor switch;

a lower power differential cascode current predriver including third and fourth low power transistors each having an emitter, a collector and a base, said low power transistors being of lower power handling capability than said first and second transistor switches;

said third and fourth low power transistors connected as a differential pair with the emitters coupled to each other and to a current source and the collectors of said third and fourth transistors respectively coupled through first and second load means to said first means; said load means between said fourth transistor and said first means including a diode means in series with resistance means to prevent saturation of said fourth low power transistor;

said collectors of said third and fourth transistors being directly connected to the respective bases of said first and second power transistor switches; and first and second level shifting means coupled to the respective bases of said third and fourth transistors and responsive to said logic "0" or logic "1" voltage levels for reducing said voltage levels at the bases of said third and fourth transistors to prevent saturation thereof.

* * * * *